(12) United States Patent
Ookuma (10) Patent No.: US 9,313,436 B2
(45) Date of Patent: Apr. 12, 2016

(54) ANALOG-DIGITAL CONVERTER, SOLID-STATE IMAGE SENSOR, AND ELECTRONIC APPARATUS FOR INCREASED RESOLUTION OF AN IMAGE

(71) Applicant: Sony Corporation, Tokyo (JP)

(72) Inventor: Keiji Ookuma, Nagasaki (JP)

(73) Assignee: SONY CORPORATION, Tokyo (JP)

( * ) Notice: Subject to any disclaimer, the term of this patent is extended or adjusted under 35 U.S.C. 154(b) by 111 days.

(21) Appl. No.: 14/087,451

(22) Filed: Nov. 22, 2013

(65) Prior Publication Data

US 2014/0166857 A1 Jun. 19, 2014

(30) Foreign Application Priority Data

Dec. 19, 2012 (JP) ................. 2012-277061

(51) Int. Cl.
| | |
|---|---|
| *H01L 27/00* | (2006.01) |
| *H04N 5/378* | (2011.01) |
| *H03M 1/46* | (2006.01) |
| *H04N 5/374* | (2011.01) |
| *H03M 1/12* | (2006.01) |

(52) U.S. Cl.
CPC ............. *H04N 5/378* (2013.01); *H03M 1/462* (2013.01); *H03M 1/123* (2013.01); *H03M 1/1225* (2013.01); *H04N 5/374* (2013.01)

(58) Field of Classification Search
CPC .............................. H04N 5/378; H03M 1/462
USPC ....................................................... 250/208.1
See application file for complete search history.

(56) References Cited

U.S. PATENT DOCUMENTS

2002/0050941 A1* 5/2002 Nozaki .................... 341/158

FOREIGN PATENT DOCUMENTS

JP 2005-278135 10/2005

* cited by examiner

*Primary Examiner* — Thanh Luu
(74) *Attorney, Agent, or Firm* — Hazuki International, LLC (57) ABSTRACT

An analog-digital converter includes: a first comparator configured to make a comparison between a pixel voltage and a first reference voltage, the pixel voltage being a signal voltage outputted from a pixel including an photoelectric conversion element, the pixel voltage corresponding to electric charge generated by the photoelectric conversion element; a second comparator configured to make a comparison between the pixel voltage and a second reference voltage; and a voltage follower configured to connect an input terminal for the first reference voltage of the first comparator and an input terminal for the second reference voltage of the second comparator through a switch.

2 Claims, 6 Drawing Sheets

ANALOG-DIGITAL CONVERTER, SOLID-STATE IMAGE SENSOR, AND ELECTRONIC APPARATUS FOR INCREASED RESOLUTION OF AN IMAGE

CROSS REFERENCE TO RELATED APPLICATIONS

This application claims the benefit of Japanese Priority Patent Application JP 2012-277061 filed Dec. 19, 2012, the entire contents of which are incorporated herein by reference.

BACKGROUND

The present technology relates to an analog-digital converter, solid-state image sensor, and electronic apparatus. In particular, the present technology relates to an analog-digital converter, solid-state image sensor, and electronic apparatus which can increase the resolution of AD conversion without trading off the processing time, the circuit area, or the like for the increased resolution and without degrading the image quality.

There have been provided solid-state image sensors, which convert an analog signal outputted from each pixel into a digital signal.

A solid-state image sensor typically has an AD conversion circuit disposed for each column therein. Signal voltages (analog signals) read from the floating diffusion (FD) of pixels arranged in a predetermined row of a pixel array are simultaneously converted into digital signals in respective columns.

Among the AD conversion methods, there has been often used a method called slope integration or ramp signal comparison. In this type, for example, a counting process is performed in parallel with a process of making a comparison between a ramp-shaped reference signal and an analog signal from a pixel; and at the point in time when the comparison process is complete, a digital signal is generated based on the counted value (for example, see Japanese Unexamined Patent Application Publication No. 2005-278135).

There is also an AD conversion method called successive approximation, in which a magnitude comparison is made between an analog signal from a pixel and a reference voltage using multiple capacitors to generate a digital signal.

SUMMARY

Image sensors are demanded to achieve higher performance and in particular to generate pixel signals more accurately. For example, there is a demand for an image sensor which can expand the dynamic range of digital signals outputted as pixel signals or reflect more minute changes in luminance value.

To achieve such an image sensor, it is necessary to increase the number of bits of a digital signal outputted as a pixel signal to increase the resolution of AD conversion.

However, if the number of bits of a digital signal is increased by the AD conversion method called slope integration or ramp signal comparison as described in Japanese Unexamined Patent Application Publication No. 2005-278135, the time necessary for AD conversion is extremely increased. For example, if the number of bits is increased by 1, the time necessary for a counting process for AD conversion is doubled. This is because the number of comparisons between the reference voltage and analog signal is doubled.

On the other hand, if the number of bits is increased by 1 using the successive approximation AD conversion method, the time necessary for a counting process for AD conversion is not doubled. The increase in the number of bits by 1 only increases the number of comparisons between analog signals and the reference voltage by 1. Accordingly, the increase in the number of bits affects the processing time to a lesser extent.

However, in the successive approximation AD conversion method, each time the number of bits of a digital signal is increased, a capacitor having a large capacitance has to be added. Addition of such a capacitor would increase the circuit area. Further, in the successive approximation AD conversion method, it is necessary to accurately set the capacitance ratios between multiple capacitors. If the capacitance ratios between the capacitors vary in accuracy, noise such as a vertical stripe may undesirably occur in an image.

As seen above, the related technologies increase the resolution of AD conversion but undesirably trade off the processing time, the circuit area, or the like for the increased resolution and tend to cause degradation of the image quality.

The present technology has been made in view of the foregoing. It is desirable to increase the resolution of AD conversion without trading off the processing time, the circuit area, or the like for the increased resolution and without degrading the image quality.

An analog-digital converter according to a first embodiment of the present technology includes: a first comparator configured to make a comparison between a pixel voltage and a first reference voltage, the pixel voltage being a signal voltage outputted from a pixel including an photoelectric conversion element, the pixel voltage corresponding to electric charge generated by the photoelectric conversion element; a second comparator configured to make a comparison between the pixel voltage and a second reference voltage; and a voltage follower configured to connect an input terminal for the first reference voltage of the first comparator and an input terminal for the second reference voltage of the second comparator through a switch.

The voltage follower may include a first voltage follower configured to output a voltage inputted to the input terminal for the first reference voltage of the first comparator to the input terminal for the second reference voltage of the second comparator and a second voltage follower configured to output a voltage inputted to the input terminal for the second reference voltage of the second comparator to the input terminal for the first reference voltage of the first comparator.

The first and second comparators may each make a plurality of comparisons. The first reference voltage may be reduced each time a comparison is made, and the second reference voltage may be increased each time a comparison is made. The amount of reduction of the first reference voltage may be reduced as the number of comparisons made by the first comparator is increased, and the amount of increase of the second reference voltage may be reduced as the number of comparisons made by the second comparator is increased.

The first and second comparators may each make a plurality of comparisons. A bit data determination unit configured to, based on a result of a comparison made by previously selected one of the first and second comparators, determine each bit of digital data obtained by converting an analog signal corresponding to the pixel voltage may be further included.

A control output unit configured to, based on information specifying the previously selected comparator and bit data outputted from the bit data determination unit, output a control signal including information specifying a comparator to be selected for a next comparison and a control signal for on/off controlling the switch of the voltage follower may be further included.

A method for analog-digital conversion according to a second embodiment of the present technology includes: making, by a first comparator, a comparison between a pixel voltage and a first reference voltage, the pixel voltage being a signal voltage outputted from a pixel including an photoelectric conversion element, the pixel voltage corresponding to electric charge generated by the photoelectric conversion element; based on a result of the comparison made by the first comparator, determining, by a bit data determination circuit, one bit of digital data obtained by converting an analog signal corresponding to the pixel voltage; outputting, by a voltage follower, a voltage inputted to an input terminal for the first reference voltage of the first comparator to an input terminal for a second reference voltage of a second comparator; making, by the second comparator, a comparison between the pixel voltage and the second reference voltage; based on a result of the comparison made by the second comparator, determining, by the bit data determination circuit, another bit of the digital data; and outputting, by the voltage follower, a voltage inputted to the input terminal for the second reference voltage of the second comparator to the input terminal for the first reference voltage of the first comparator.

A third embodiment of the present technology provides a solid-state image sensor including an analog-digital converter, the analog-digital converter including: a first comparator configured to make a comparison between a pixel voltage and a first reference voltage, the pixel voltage being a signal voltage outputted from a pixel including an photoelectric conversion element, the pixel voltage corresponding to electric charge generated by the photoelectric conversion element; a second comparator configured to make a comparison between the pixel voltage and a second reference voltage; and a voltage follower configured to connect an input terminal for the first reference voltage of the first comparator and an input terminal for the second reference voltage of the second comparator through a switch.

A fourth embodiment of the present technology provides an electronic apparatus including a solid-state image sensor including an analog-digital converter, the analog-digital converter including: a first comparator configured to make a comparison between a pixel voltage and a first reference voltage, the pixel voltage being a signal voltage outputted from a pixel including an photoelectric conversion element, the pixel voltage corresponding to electric charge generated by the photoelectric conversion element; a second comparator configured to make a comparison between the pixel voltage and a second reference voltage; and a voltage follower configured to connect an input terminal for the first reference voltage of the first comparator and an input terminal for the second reference voltage of the second comparator through a switch.

In the first to fourth embodiments, the first comparator makes a comparison between the pixel voltage and the first reference voltage, the pixel voltage being a signal voltage outputted from a pixel including an photoelectric conversion element, the pixel voltage corresponding to electric charge generated by the photoelectric conversion element; the second comparator makes a comparison between the pixel voltage and the second reference voltage; and the voltage follower connects the input terminal for the first reference voltage of the first comparator and the input terminal for the second reference voltage of the second comparator through the switch.

According to the present technology, it is possible to increase the resolution of AD conversion without trading off the processing time, the circuit area, or the like for the increased resolution and without degrading the image quality.

DETAILED DESCRIPTION OF EMBODIMENTS

Now, an embodiment of the present technology will be described with reference to the accompanying drawings.

Figure 1:
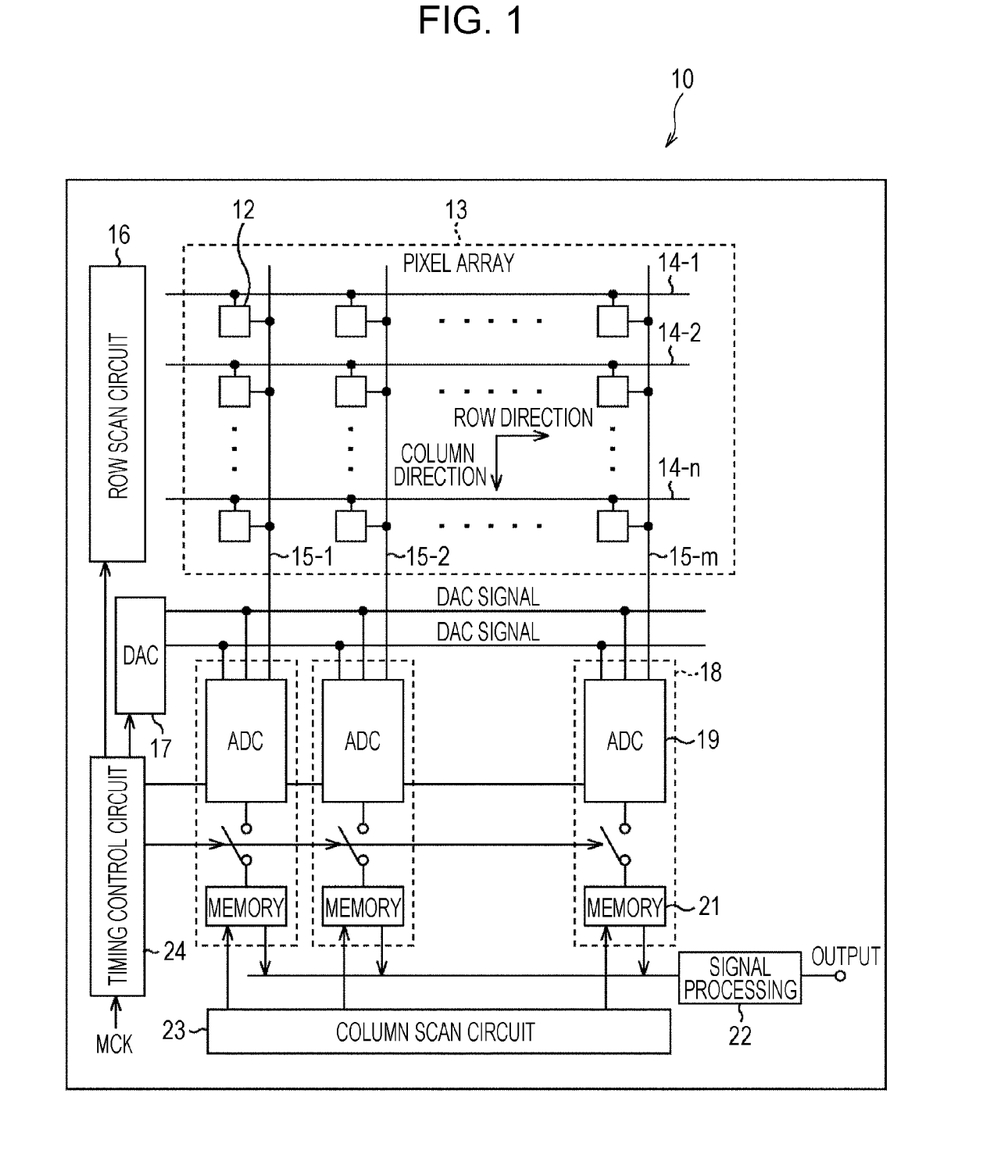
FIG. 1 is a diagram showing an example configuration of a solid-state image sensor according to one embodiment of the present technology.

FIG. 1 is a diagram showing an example configuration of a solid-state image sensor according to one embodiment of the present technology. A solid-state image sensor 10 shown in FIG. 1 is, for example, a CMOS image sensor.

As shown in FIG. 1, the solid-state image sensor 10 includes a pixel array 13, a row scan circuit 16, a DAC 17, column ADCs 18, a signal processing unit 22, a column scan circuit 23, and a timing control circuit 24.

In the pixel array 13, unit pixels 12 are arranged in a matrix of n rows×m columns. The pixel array 13 includes horizontal signal lines 14-1 to 14-$n$ and vertical signal lines 15-1 to 15-$m$.

Each pixel 12 includes a photoelectric conversion element (e.g., photodiode), a transfer transistor, a reset transistor, and an amplifier transistor. The transfer transistor transfers electric charge obtained by the photoelectric conversion element to a floating diffusion (FD). The reset transistor resets the potential of the FD. The amplifier transistor outputs a pixel signal corresponding to the potential of the FD.

The operations of the transistors are controlled by signals provided by the row scan circuit 16 through the horizontal signal lines 14-1 to 14-$n$. Instead of the above three-transistor configuration, each unit pixel 12 may have, for example, a four-transistor configuration which includes a selection transistor for selecting a pixel.

Based on the signals provided by the row scan circuit 16 through the horizontal signal lines 14-1 to 14-$n$, the unit pixels 12 outputs pixel signals corresponding to electric charge accumulated in the photoelectric conversion elements thereof to the vertical signal lines 15-1 to 15-$m$.

The timing control circuit 24 provides a clock signal or timing signal necessary for a predetermined operation to the row scan circuit 16 and the column scan circuit 23 on the basis of a master clock having a predetermined frequency. For example, the timing control circuit 24 provides a timing signal for controlling a pixel shatter operation or pixel read operation to the row scan circuit 16 and the column scan circuit 23.

The row (vertical) scan circuit 16 provides signals for controlling output of a pixel signal to the pixels arranged in the vertical direction of the pixel array 13 sequentially at predetermined timings.

The column ADCs 18 correspond to the m number of columns of the pixel array one-to-one. The m number of column ADCs 18 each include an analog-digital converter (ADC) circuit 19. Connected to the ADC circuits 19 are the vertical signal lines 15-1 to 15-m.

The ADC circuits 19 perform a correlated double sampling (CDS) process on signals (signal voltages) provided by the unit pixels 12 through the vertical signal lines 15-1 to 15-m and convert the resulting signals into digital signals.

Each ADC circuit 19 performs the CDS process and AD conversion process by making a comparison between a DAC signal A or DAC signal B outputted from the DAC 17 and the signal voltage and counting up and down until the magnitude relationship between the DAC signal A or DAC signal B and the signal voltage is determined.

The DAC 17 outputs a DAC signal A, which is a ramp wave for setting a voltage value serving as the basis for comparison to a lower value, and a DAC signal B, which is a ramp wave for setting a voltage value serving as the basis for comparison to a higher value.

Each ADC circuit 19 temporarily stores the AD-converted data in a corresponding memory 21 and then outputs the data to the signal processing unit 22 under the control of the column scan circuit 23.

The column scan circuit 23 causes the ADC circuits 19 to output the data stored in the corresponding memories 21 to the signal processing unit 22 sequentially at predetermined timings.

The signal processing unit 22 generates a pixel signal from the data provided by each memory 21, for example, by performing image processing on the data, and outputs the pixel signal.

Figure 2:
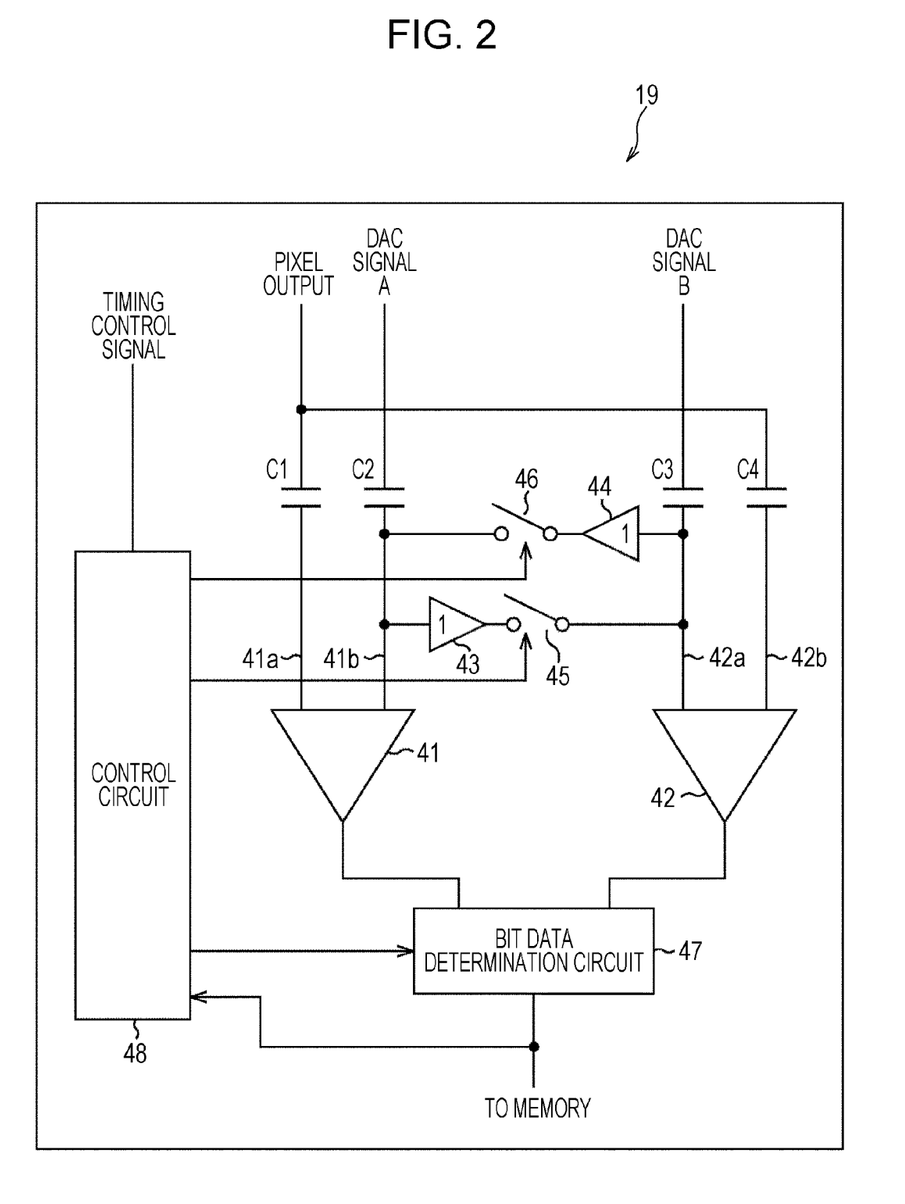
FIG. 2 is a diagram showing an example of a detailed configuration of an ADC circuit of FIG. 1.

FIG. 2 is a diagram showing an example of a detailed configuration of one of the ADC circuits 19 of FIG. 1.

As shown in FIG. 2, the ADC circuit 19 includes comparators 41 and 42.

The comparator 41 receives a pixel output (a signal voltage outputted from a unit pixel 12) and a DAC signal A. The potential difference of the pixel output is held by a capacitance C1 and then provided to a terminal 41a of the comparator 41. The potential difference of the DAC signal A is held by a capacitance C2 and then provided to a terminal 41b of the comparator 41. The comparator 41 makes a comparison in magnitude between the pixel output and the DAC signal A and outputs a signal indicating the comparison result to a bit data determination circuit 47.

The ADC circuit 19 also includes voltage followers 43 and 44.

When a switch 45 is closed, the voltage follower 43 copies the potential difference held by the capacitance C2 to a capacitance C3. When a switch 46 is closed, the voltage follower 44 copies the potential difference held by the capacitance C3 to the capacitance C2.

A voltage follower is a type of non-inverting amplifier and outputs a potential difference received at one terminal thereof from the other terminal as it is.

That is, when the switch 45 is closed, the same voltage as the voltage which has been applied to the terminal 41b thus far is applied to a terminal 42a. Similarly, when the switch 46 is closed, the same voltage as the voltage which has been applied to the terminal 42a thus far is applied to the terminal 41b.

Based on a control signal from a control circuit 48, the bit data determination circuit 47 selects between the comparison result from the comparator 41 and the comparison result from the comparator 42 and determines the bit data on the basis of the selected comparison result. The bit data determination circuit 47 then outputs the determined bit data to the memory 21 and the control circuit 48.

The control circuit 48 on/off controls the switches 45 and 46 by outputting a switching signal thereto on the basis of a timing control signal provided by the timing control circuit 24.

Figure 3:
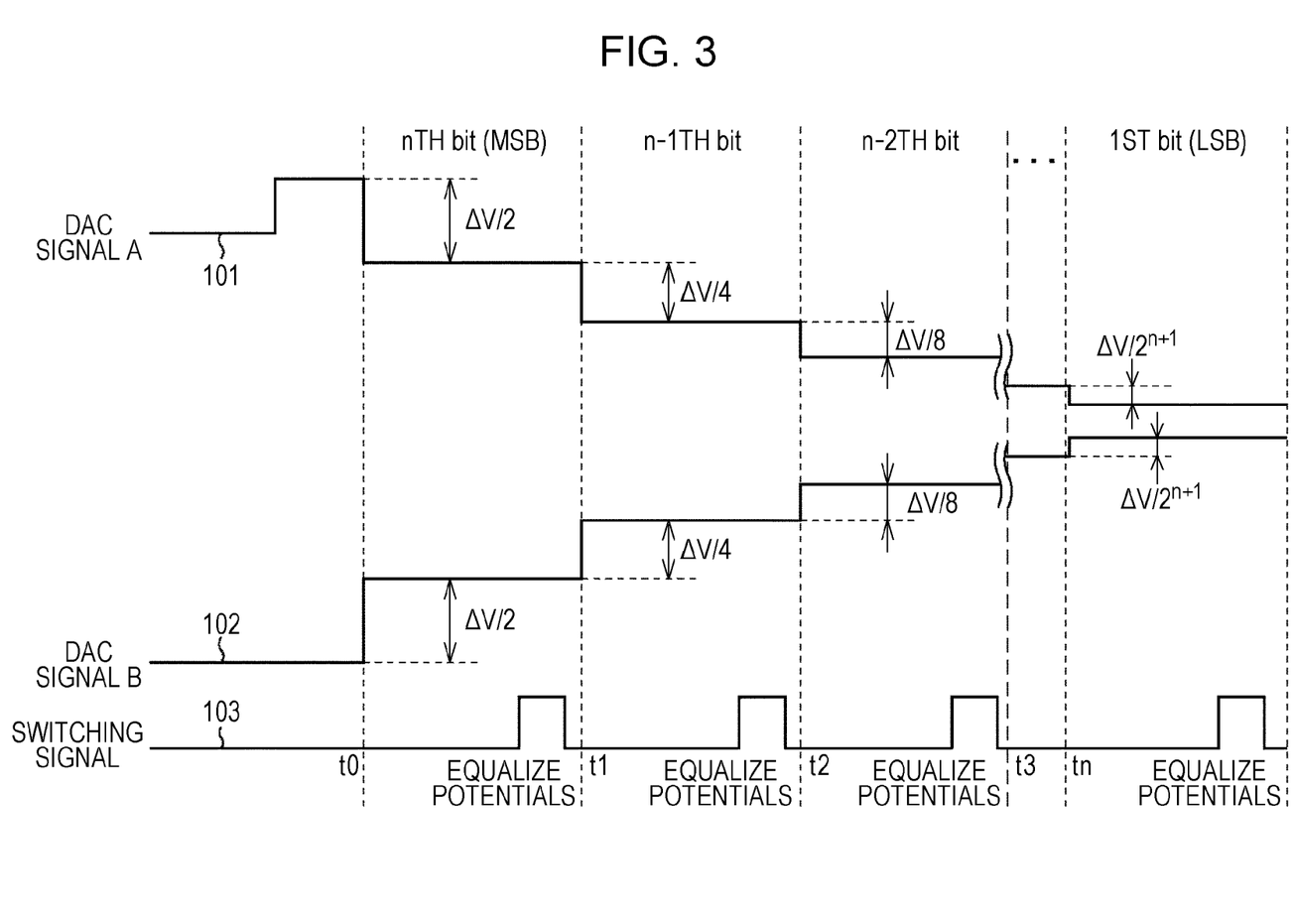
FIG. 3 is a diagram showing a DAC signal, another DAC signal, and a switching signal.

FIG. 3 is a diagram showing a DAC signal A, a DAC signal B, and a switching signal. In FIG. 3, the horizontal axis represents the time; a line 101 represents the waveform of the DAC signal A; a line 102 represents the waveform of the DAC signal B; and a line 103 represents the waveform of the switching signal.

As shown in FIG. 3, the DAC signal A has a waveform where the voltage value gradually decreases from time t0, when a comparison is started. Specifically, the voltage value of the DAC signal A decreases by $\Delta V/2$ at time t0, by $\Delta V/4$ at time t1, by $\Delta V/8$ at time t2, ... and by $\Delta V/2^{n+1}$ at time tn.

On the other hand, the DAC signal B has a waveform where the voltage value gradually increases from time t0, when the comparison is started. Specifically, the voltage value of the DAC signal B increases by $\Delta V/2$ at time t0, by $\Delta V/4$ at time t1, by $\Delta V/8$ at time t2, ... and by $\Delta V/2^{n+1}$ at time tn.

The switching signal forms one pulse between times t0 and t1. Similarly, the switching signal forms one pulse each between times t1 and t2, between times t2 and t3, and the like. Hereafter, the periods between times t0 and t1, between times t1 and t2, between times t2 and t3, and the like are will be referred to as comparative periods.

In each comparative period, the comparator 41 or comparator 42 makes a comparison. Before the comparative period ends, a pulse of the switching signal is inputted to the switch 45 or switch 46. Thus, the switch 45 or switch 46 is closed (turned on). Equalization of the potentials performed at this time will be described later.

Figure 4:
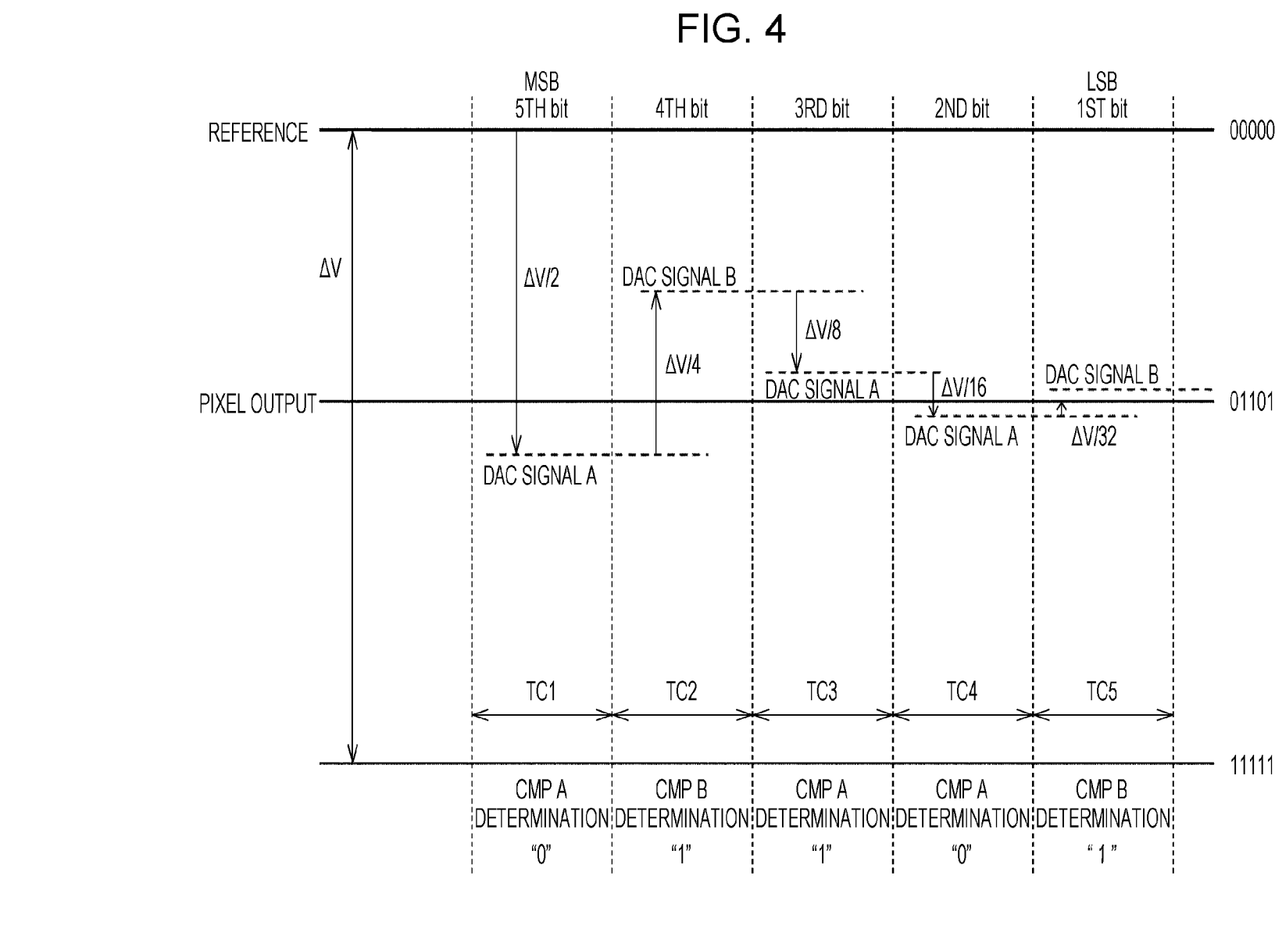
FIG. 4 is a diagram showing comparisons made by comparators and a method by which a bit data determination circuit generates digital data.

FIG. 4 is a diagram showing comparisons made by the comparators 41 and 42 and the method by which the bit data determination circuit 47 generates digital data. It is assumed that the direction in which the binary value of the bit data becomes smaller is the forward direction. When the pixel voltage is smaller than the reference voltage, the bit data is determined to "1", while when the pixel voltage is larger than the reference voltage, the bit data is determined to "0".

In FIG. 4, the horizontal axis represents the time, and the vertical axis represents the potential difference. FIG. 4 shows an example in which the pixel output is converted into 5-bit digital data. Of the 5-bit digital data, the 5th bit is represented by MSB, and the 1st bit is represented by LSB.

The capacitors C2 and C3 each previously hold $\Delta V$, which a potential difference exceeding the pixel output. That is, before the comparators 41 and 42 make comparisons, the capacitors C2 and C3 each hold the reference potential difference $\Delta V$.

In the first comparative period, TC1, a DAC signal A reduces the potential difference held by the capacitance C2 by $\Delta V/2$ and then the comparator 41 makes a comparison in magnitude between the voltage value of the pixel output (the voltage applied to the terminal 41a) and the voltage value of the DAC signal A (the voltage applied to the terminal 41b). The comparator 41 then determines that the voltage value of the pixel output is greater than the voltage value of the DAC signal A.

Hereafter, the voltage of the pixel output will be referred to as the pixel voltage, and the voltage of the DAC signal A or DAC signal B as the reference voltage.

Based on the comparison result, the bit data determination circuit 47 sets the MSB (5th bit) to "0" and outputs the bit data "0" to the control circuit 48 and the memory 21.

Based on the output from the bit data determination circuit 47, the control circuit 48 on/off controls the switches 45 and 46 and determines a comparator to be used in the next comparative period, TC2. Since the comparator 41 has determined that the pixel voltage is greater than the reference voltage, on the basis of the comparison result, the control circuit 48 closes the switch 45 and determines the comparator to be used in the next comparative period, as the comparator 42.

Due to the closure of the switch 45, the potential difference held by the capacitance C3 becomes equal to that held by the capacitance C2. As seen above, the potentials of the capacitors C2 and C3 are equalized.

In the next comparative period, TC2, a DAC signal B increases the potential difference held by the capacitance C3 by $\Delta V/4$ and then the comparator 42 makes a comparison in magnitude between the voltage value of the pixel output (the voltage applied to the terminal 42b) and the voltage value of the DAC signal B (the voltage applied to the terminal 42a). The comparator 42 then determines that the pixel voltage is smaller than the new reference voltage.

Since the potential difference held by the capacitance C3 has become equal to that of the capacitance C2 before the comparative period TC1 ends, the new reference voltage is a voltage which is greater than the reference voltage in the preceding comparative period (in this case, the comparative period TC1) by $\Delta V/4$.

Based on the comparison result, the bit data determination circuit 47 sets the 4th bit to "1" and outputs the bit data "1" to the control circuit 48 and the memory 21.

Based on the output from the bit data determination circuit 47, the control circuit 48 on/off controls the switches 45 and 46 and determines a comparator to be used in the next comparative period, TC3. Since the comparator 42 has determined that the pixel voltage is smaller than the reference voltage, on the basis of the comparison result, the control circuit 48 closes the switch 46 and determines the comparator to be used in the next comparative period, as the comparator 41.

Due to the closure of the switch 46, the potential difference held by the capacitance C2 becomes equal to that held by the capacitance C3. In this way, the potentials of the capacitors C2 and C3 are equalized.

In the next comparative period, TC3, a DAC signal A reduces the potential difference held by the capacitance C2 by $\Delta V/8$ and then the comparator 41 makes a comparison in magnitude between the pixel voltage and the new reference voltage. The comparator 41 then determines that the pixel voltage is smaller than the reference voltage.

Since the potential difference held by the capacitance C2 has become equal to that of the capacitance C3 before the comparative period TC2 ends, the new reference voltage is a voltage which is smaller than the reference voltage in the preceding comparative period (in this case, the comparative period TC2) by $\Delta V/8$.

Based on the comparison result, the bit data determination circuit 47 sets the 3rd bit to "1" and outputs the bit data "1" to the control circuit 48 and the memory 21.

Based on the output from the bit data determination circuit 47, the control circuit 48 on/off controls the switches 45 and 46 and determines a comparator to be used in the next comparative period, TC4. Since the comparator 41 has determined that the pixel voltage is smaller than the reference voltage, on the basis of the comparison result, the control circuit 48 determines the comparator to be used in the next comparative period, as the comparator 41.

Since the comparator 41, which has been used in the present comparison period (comparative period TC3), is to be used also in the next comparative period (comparative period TC4), potential equalization does not have to be performed.

In the next comparative period, TC4, a DAC signal A reduces the potential difference held by the capacitance C2 by $\Delta V/16$ and then the comparator 41 makes a comparison in magnitude between the pixel voltage and the new reference voltage. The comparator 41 then determines that the pixel voltage is greater than the reference voltage.

Since the potential difference held by the capacitance C2 remains the same as that in the preceding comparative period (in this case, the comparative period TC3), the new reference voltage is a voltage which is smaller than the reference voltage in the comparative period TC3 by $\Delta V/16$.

Based on the comparison result, the bit data determination circuit 47 sets the 4th bit to "0" and outputs the bit data "0" to the control circuit 48 and the memory 21.

Based on the output from the bit data determination circuit 47, the control circuit 48 on/off controls the switches 45 and 46 and determines a comparator to be used in the next comparative period, TC5. Since the comparator 41 has determined that the pixel voltage is greater than the reference voltage, on the basis of the comparison result, the control circuit 48 closes the switch 45 and determines the comparator to be used in the next comparative period, as the comparator 42.

Due to the closure of the switch 45, the potential difference held by the capacitance C3 becomes equal to that held by the capacitance C2. In this way, the potentials of the capacitors C2 and C3 are equalized.

In the next comparative period, TC5, a DAC signal B increases the potential difference held by the capacitance C3 by $\Delta V/32$ and then the comparator 42 makes a comparison in magnitude between the pixel voltage and the new reference voltage. The comparator 42 then determines that the pixel voltage is smaller than the reference voltage.

Since the potential difference held by the capacitance C3 has become equal to that of the capacitance C2 before the comparative period TC4 ends, the new reference voltage is a voltage which is smaller than the reference voltage in the preceding comparative period (in this case, the comparative period TC4) by $\Delta V/32$.

Based on the comparison result, the bit data determination circuit 47 sets the 5th bit to "1" and outputs the bit data "1" to the control circuit 48 and the memory 21.

As seen above, when the pixel voltage is determined to be greater than the reference voltage, the bit data determination circuit 47 sets the bit data to "0"; when the pixel voltage is determined to be smaller than the reference voltage, it sets the bit data to "1".

In the first comparative period, the control circuit 48 usually causes the bit data determination circuit 47 to select the comparison result made by the comparator 41. In the subsequent comparative periods, the control circuit 48 determines a comparator to be selected, on the basis of the comparison result.

That is, when the bit data "0" is outputted based on the comparison result made by the comparator 41, the comparator to be used in the next comparative period is determined as the comparator 42. In contrast, when the bit data "1" is outputted based on the comparison result made by the comparator 41, the comparator to be used in the next comparative period is determined as the comparator 41.

On the other hand, when the bit data "1" is outputted based on the comparison result made by the comparator 42, the comparator to be used in the next comparative period is determined as the comparator 41. In contrast, when the bit data "0" is outputted based on the comparison result made by the comparator 42, the comparator to be used in the next comparative period is determined as the comparator 42.

Note that the control circuit 48 provides, to the bit data determination circuit 47, a control signal including information specifying the comparator to be used in the next comparative period. For example, the initial value of this control signal includes information specifying the comparator 41. Accordingly, the control circuit 48 determines the comparison to be used in the next comparative period, on the basis of the bit data outputted from the bit data determination circuit 47 and the information specifying the comparator included in the control signal outputted by the control circuit 48.

The control circuit 48 also on/off controls the switch 45 or switch 46 in accordance with the comparator used in the present comparative period and the comparator to be used in the next comparative period. For example, if the comparator used in the present comparative period is the comparator 41 and if the comparator to be used in the next comparative period is the comparator 42, the control circuit 48 turns on the switch 45 and turns off the switch 46. In contrast, if the comparator used in the present comparative period is the comparator 42 and if the comparator to be used in the next comparative period is the comparator 41, the control circuit 48 turns on the switch 46 and turns off the switch 45. The control circuit 48 on/off controls the switches 45 and 46, for example, by providing a control signal thereto.

As seen above, a magnitude comparison is made between the pixel voltage and the reference voltage and then each bit of the 5-bit digital data is set based on the comparison result. Thus, it is possible to increase the resolution of AD conversion without significantly increasing the time used for AD conversion.

Of the traditional AD conversion methods, the method called slope integration or ramp signal comparison is often used. In this method, for example, a counting process is performed in parallel with a process of comparing a ramp-shaped reference signal and an analog signal from a pixel; and when the comparison process is complete, a digital signal is generated based on the counted value.

However, if the number of bits of a digital signal is increased by the AD conversion method called slope integration or ramp signal comparison, the time necessary for AD conversion is extremely increased. For example, if the number of bits is increased by 1, the time necessary for performing a counting process in the D phase period for AD conversion is at least doubled.

For example, if 5-bit digital data is converted into G-bit digital data, the number of values which can be represented by the digital data is increased from 0 to 31 to 0 to 63. That is, for the 5-bit digital data, AD conversion is possible by changing the level of a ramp signal (reference voltage) into 32 levels and comparing each level with the pixel voltage. For the 6-bit digital data, on the other hand, AD conversion is not possible unless the level of a ramp signal (reference voltage) is changed to 64 levels and then each level is compared with the pixel voltage.

As seen above, as the number of bits of digital data is increased, the time necessary for AD conversion is extremely increased. The method called successive approximation is a method which can prevent such a time increase. In the successive approximation AD conversion method, AD conversion is achieved by making a comparison in magnitude between an analog signal from a pixel and the reference voltage using multiple capacitors and generating digital data based on the comparison result.

Specifically, the capacitors are disposed in parallel in such a manner that the capacitance ratios are twice, 4 times, 8 times, 16 times, and the like; voltages corresponding to the potential differences held by these capacitors are used as reference voltages; and comparisons are made between the pixel voltage and the reference voltages.

If 5-bit digital data is converted into 6-bit digital data using the successive approximation AD conversion method, a capacitor having a capacitance ratio of 32 times is added on the circuit, and a process of making a comparison between the reference voltage of the added capacitor and the pixel voltage is added. Thus, even when the number of bits is increased from 5 to 6, the number of comparisons is only increased by 1. As a result, there is prevented an extreme increase in the time necessary for AD conversion associated with an increase in the number of bits of digital data.

However, in the successive approximation AD conversion method, each time the number of bits of digital data is increased, it is necessary to add a capacitor having a large capacitance. Since a capacitor having a larger capacitance typically uses a larger area on the circuit, an increase in the number of bits would significantly increase the area of the ADC circuit.

Further, in the successive approximation AD conversion method, it is necessary to accurately set the capacitance ratios between the capacitors. If the capacitance ratios between the capacitors vary in accuracy, noise such as a vertical stripe undesirably may occur in an image.

On the other hand, the present technology does not have to dispose multiple capacitors unlike the successive approximation AD conversion method. Accordingly, even when the number of bits is increased, an increase in the area of the ADC circuit would be prevented. Further, noise resulting from variations in the accuracy of the capacitance ratios between the capacitors would not occur. Furthermore, since the present technology does not determine bit data by counting unlike the AD conversion method called slope integration or ramp signal comparison, the number of comparisons would not be significantly increased even when the number of bits is increased.

As a result, according to the present technology, it is possible to increase the resolution of AD conversion without trading off the processing time, the circuit area, or the like for the increased resolution and without degrading the image quality.

Figure 5:
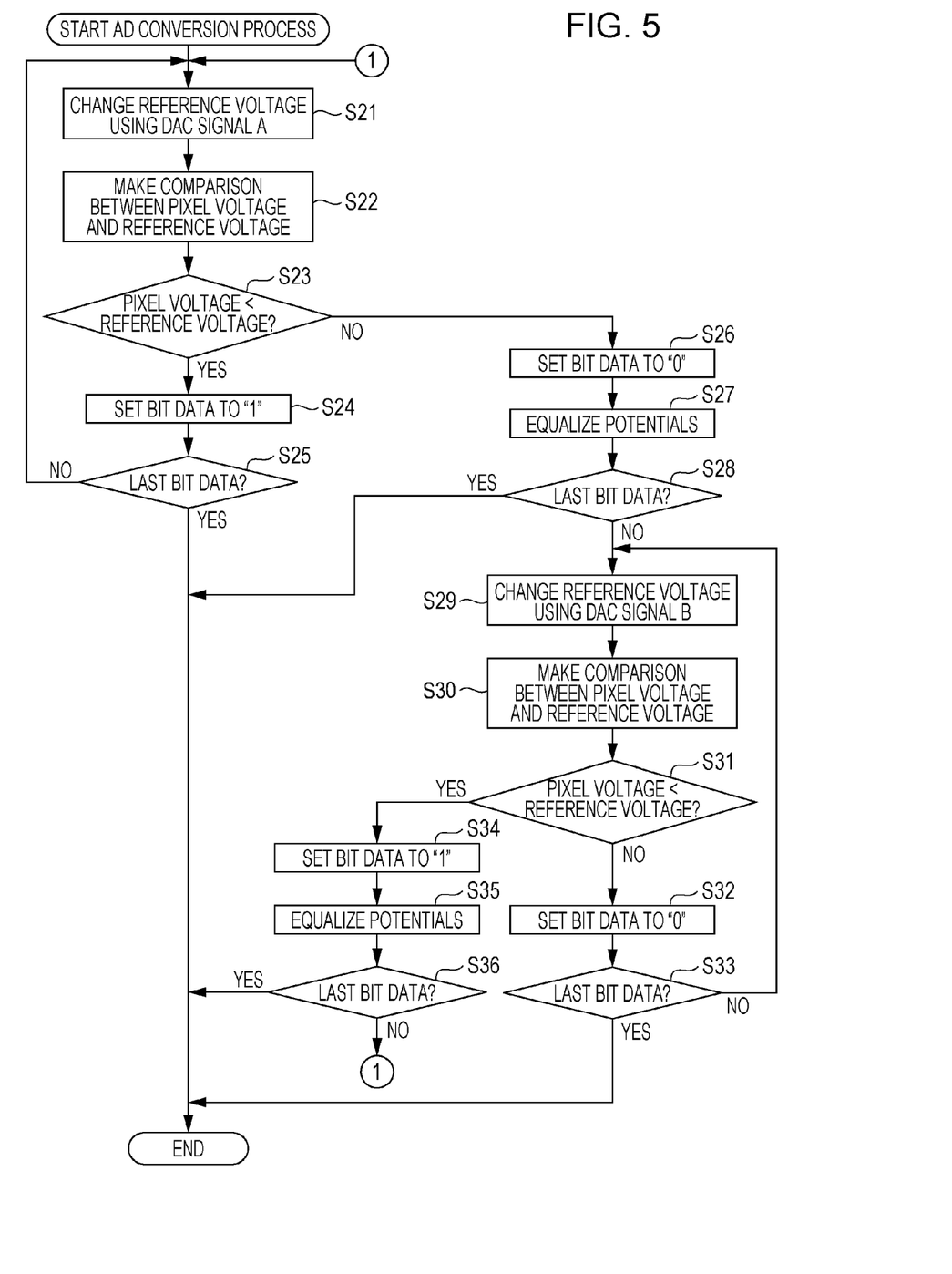
FIG. 5 is a flowchart showing an example of an AD conversion process.

Next, referring to a flowchart of FIG. 5, there will be described an example of an AD conversion process performed by the ADC circuit 19 according to the present technology.

In step S21, a DAC signal A reduces the potential difference held by the capacitance C2. Thus, the reference voltage is changed.

In step S22, the comparator 41 makes a comparison in magnitude between the pixel voltage and the reference voltage.

In step S23, the bit data determination circuit 47 determines whether the pixel voltage is smaller than the reference voltage.

If the pixel voltage is determined in step S23 to be smaller than the reference voltage, the process proceeds to step S24.

In step S24, the bit data determination circuit 47 sets the bit data to "1".

In step S25, whether the bit is the last bit is determined. If the bit is determined not to be the last bit, the process returns to step S21.

If the pixel voltage is determined in step S23 not to be smaller than the reference voltage, the process proceeds to step S26.

In step S26, the bit data determination circuit 47 sets the bit data to "0".

In step S27, the control circuit 48 turns on the switch 45 and turns off the switch 46 to equalize the potentials. That is, the potential difference held by the capacitance C3 becomes equal to that held by the capacitance C2.

In step S28, whether the bit is the last bit is determined. If the bit is determined not to be the last bit, the process proceeds to step S29.

In step S29, a DAC signal B increases the potential difference held by the capacitance C3. Thus, the reference voltage is changed.

In step S30, the comparator 42 makes a comparison in magnitude between the pixel voltage and the reference voltage.

In step S31, the bit data determination circuit 47 determines whether the pixel voltage is smaller than the reference voltage.

If the pixel voltage is determined in step S31 not to be smaller than the reference voltage, the process proceeds to step S32.

In step S32, the bit data determination circuit 47 sets the bit data to "0".

In step S33, whether the bit is the last bit is determined. If the bit is determined not to be the last bit, the process returns to step S29.

If the pixel voltage is determined in step S31 to be smaller than the reference voltage, the process proceeds to step S34.

In step S34, the bit data determination circuit 47 sets the bit data to "1".

In step S35, the control circuit 48 turns on the switch 46 and turns off the switch 45 to equalize the potentials. That is, the potential difference held by the capacitance C2 becomes equal to that held by the capacitance C3.

In step S36, whether the bit is the last bit is determined. If the bit is determined not to be the last bit, the process returns to step S21.

If the bit is determined to be the last bit, in step S25, step S28, step S33, or step S36, the process ends.

In this way, the AD conversion process is performed.

Figure 6:
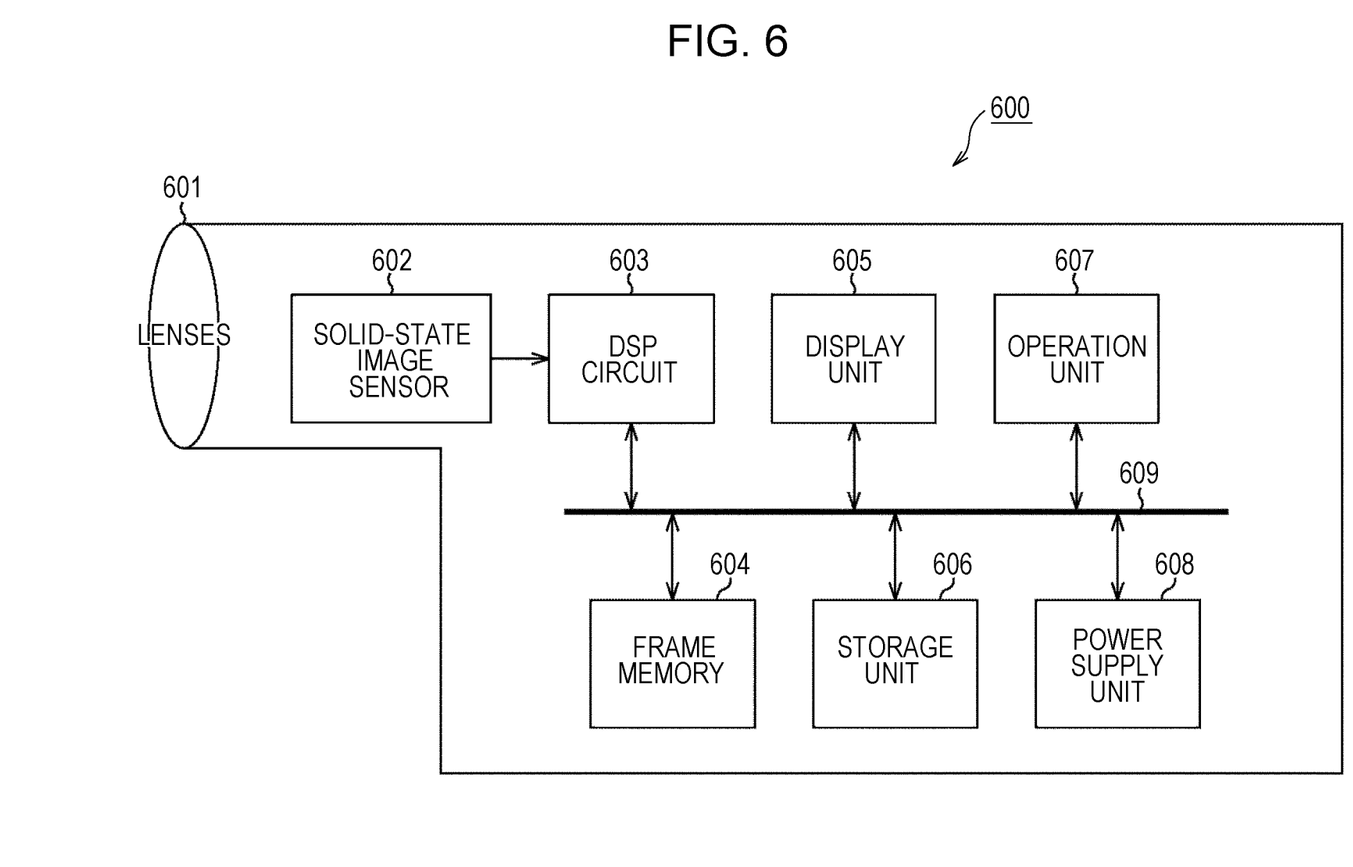
FIG. 6 is a block diagram showing an example configuration of a camera apparatus which is an electronic apparatus according to the present technology.

FIG. 6 is a block diagram showing an example configuration of a camera apparatus which is an electronic apparatus according to the present technology.

A camera apparatus 600 of FIG. 6 includes an optical unit 601 including lenses and the like, a solid-state image sensor (imaging device) 602, and a DSP circuit 603 serving as a camera signal processing circuit. The camera apparatus 600 also includes a frame memory 604, a display unit 605, a recording unit 606, an operation unit 607, and a power supply unit 608. The DSP circuit 603, the frame memory 604, the display unit 605, the recording unit 606, the operation unit 607, and the power supply unit 608 are connected together through a bus line 609.

The optical unit 601 receives incident light (image light) from the subject and forms an image on the imaging surface of the solid-state image sensor 602. The solid-state image sensor 602 converts the amount of the incident light, which has formed the image on the imaging surface by the optical unit 601, into an electrical signal on a pixel basis and outputs the electric signal as a pixel signal. The solid-state image sensor 602 may be the CMOS image sensor (solid-state image sensor 10) according to the present embodiment.

The display unit 605 is, for example, a panel display apparatus, such as a liquid crystal panel or organic electro luminescence (EL) panel, and displays moving images or still images captured by the solid-state image sensor 602. The recording unit 606 records the moving images or still images captured by the solid-state image sensor 602 on a recording medium, such as a video tape or digital versatile disk (DVD).

The operation unit 607 issues operation instructions related to various functions of the camera apparatus 600 on the basis of operations of the user. The power supply unit 608 supplies power to the DSP circuit 603, the frame memory 604, the display unit 605, the recording unit 606, and the operation unit 607 as necessary.

The present technology is applicable to solid-state image sensors which detect the distribution of the amount of incident visible light and form images, as well as to solid-state image sensors which detect the distribution of the amount of incident infrared rays, x rays, particles, or the like and form images and solid-state image sensors (physical quantity distribution detectors) in a broad sense, such as fingerprint detection sensors, which detect the distribution of other physical quantities, such as pressure or capacitance, and form images.

Note that the series of processes described in the present specification include processes which are performed in a time series manner in the order in which they are described, as well as processes which are performed not in a time series manner but in parallel or independently.

Embodiments of the present technology are not limited to the above embodiment, and various changes can be made thereto without departing from the spirit and scope of the present technology.

The present technology may be configured as follows:

(1) An analog-digital converter including: a first comparator configured to make a comparison between a pixel voltage and a first reference voltage, the pixel voltage being a signal voltage outputted from a pixel including an photoelectric conversion element, the pixel voltage corresponding to electric charge generated by the photoelectric conversion element; a second comparator configured to make a comparison between the pixel voltage and a second reference voltage; and a voltage follower configured to connect an input terminal for the first reference voltage of the first comparator and an input terminal for the second reference voltage of the second comparator through a switch.

(2) The analog-digital converter according to (1), wherein the voltage follower includes a first voltage follower configured to output a voltage inputted to the input terminal for the first reference voltage of the first comparator to the input terminal for the second reference voltage of the second comparator and a second voltage follower configured to output a voltage inputted to the input terminal for the second reference voltage of the second comparator to the input terminal for the first reference voltage of the first comparator.

(3) The analog-digital converter according to (1) or (2), wherein the first and second comparators each make a plurality of comparisons, and wherein the first reference voltage is reduced each time a comparison is made, and the second reference voltage is increased each time a comparison is made, and wherein the amount of reduction of the first reference voltage is reduced as the number of comparisons made by the first comparator is increased, and the amount of increase of the second reference voltage is reduced as the number of comparisons made by the second comparator is increased.

(4) The analog-digital converter according to any one of (1) to (3), wherein the first and second comparators each make a plurality of comparisons, further including a bit data determination unit configured to, based on a result of a comparison made by previously selected one of the first and second comparators, determine each bit of digital data obtained by converting an analog signal corresponding to the pixel voltage.

(5) The analog-digital converter according to (4), further including a control output unit configured to, based on information specifying the previously selected comparator and bit data outputted from the bit data determination unit, output a control signal including information specifying a comparator to be selected for a next comparison and a control signal for on/off controlling the switch of the voltage follower.

(6) A method for analog-digital conversion, including: making, by a first comparator, a comparison between a pixel voltage and a first reference voltage, the pixel voltage being a signal voltage outputted from a pixel including an photoelectric conversion element, the pixel voltage corresponding to electric charge generated by the photoelectric conversion element; based on a result of the comparison made by the first comparator, determining, by a bit data determination circuit, one bit of digital data obtained by converting an analog signal corresponding to the pixel voltage; outputting, by a voltage follower, a voltage inputted to an input terminal for the first reference voltage of the first comparator to an input terminal for a second reference voltage of a second comparator; making, by the second comparator, a comparison between the pixel voltage and the second reference voltage; based on a result of the comparison made by the second comparator, determining, by the bit data determination circuit, another bit of the digital data; and outputting, by the voltage follower, a voltage inputted to the input terminal for the second reference voltage of the second comparator to the input terminal for the first reference voltage of the first comparator.

(7) A solid-state image sensor including an analog-digital converter, the analog-digital converter including: a first comparator configured to make a comparison between a pixel voltage and a first reference voltage, the pixel voltage being a signal voltage outputted from a pixel including an photoelectric conversion element, the pixel voltage corresponding to electric charge generated by the photoelectric conversion element; a second comparator configured to make a comparison between the pixel voltage and a second reference voltage; and a voltage follower configured to connect an input terminal for the first reference voltage of the first comparator and an input terminal for the second reference voltage of the second comparator through a switch.

(8) An electronic apparatus including a solid-state image sensor including an analog-digital converter, the analog-digital converter including: a first comparator configured to make a comparison between a pixel voltage and a first reference voltage, the pixel voltage being a signal voltage outputted from a pixel including an photoelectric conversion element, the pixel voltage corresponding to electric charge generated by the photoelectric conversion element; a second comparator configured to make a comparison between the pixel voltage and a second reference voltage; and a voltage follower configured to connect an input terminal for the first reference voltage of the first comparator and an input terminal for the second reference voltage of the second comparator through a switch.

It should be understood by those skilled in the art that various modifications, combinations, sub-combinations and alterations may occur depending on design requirements and other factors insofar as they are within the scope of the appended claims or the equivalents thereof.

What is claimed is:

1. An analog-digital converter comprising:
   a first comparator configured to make a comparison between a pixel voltage and a first reference voltage, the pixel voltage being a signal voltage outputted from a pixel including an photoelectric conversion element, the pixel voltage corresponding to electric charge generated by the photoelectric conversion element;
   a second comparator configured to make a comparison between the pixel voltage and a second reference voltage; and
   a voltage follower configured to connect an input terminal for the first reference voltage of the first comparator and an input terminal for the second reference voltage of the second comparator through a switch,
   wherein the first and second comparators each make a plurality of comparisons, and
   wherein the first reference voltage is reduced each time a comparison is made, and the second reference voltage is increased each time a comparison is made, and
   wherein the amount of reduction of the first reference voltage is reduced as the number of comparisons made by the first comparator is increased, and the amount of increase of the second reference voltage is reduced as the number of comparisons made by the second comparator is increased.

2. An analog-digital converter comprising:
   a first comparator configured to make a comparison between a pixel voltage and a first reference voltage, the pixel voltage being a signal voltage outputted from a pixel including an photoelectric conversion element, the pixel voltage corresponding to electric charge generated by the photoelectric conversion element;
   a second comparator configured to make a comparison between the pixel voltage and a second reference voltage; and
   a voltage follower configured to connect an input terminal for the first reference voltage of the first comparator and an input terminal for the second reference voltage of the second comparator through a switch,
   wherein the first and second comparators each make a plurality of comparisons, further comprising
   a bit data determination unit configured to, based on a result of a comparison made by previously selected one of the first and second comparators, determine each bit of digital data obtained by converting an analog signal corresponding to the pixel voltage, and
   a control output unit configured to, based on information specifying the previously selected comparator and bit data outputted from the bit data determination unit, output a control signal including information specifying a comparator to be selected for a next comparison and a control signal for on/off controlling the switch of the voltage follower.

* * * * *